United States Patent
Cha et al.

(10) Patent No.: US 8,546,881 B2
(45) Date of Patent: Oct. 1, 2013

(54) SEMICONDUCTOR DEVICE

(75) Inventors: Jae-Han Cha, Chungcheongbuk-do (KR); Kyung-Ho Lee, Chungcheongbuk-do (KR); Sun-Goo Kim, Chungcheongbuk-do (KR); Hyung-Suk Choi, Chungcheongbuk-do (KR); Ju-Ho Kim, Chungcheongbuk-do (KR); Jin-Young Chae, Chungcheongbuk-do (KR); In-Taek Oh, Chungcheongbuk-do (KR)

(73) Assignee: MagnaChip Semiconductor, Ltd. (KR)

( * ) Notice: Subject to any disclaimer, the term of this patent is extended or adjusted under 35 U.S.C. 154(b) by 342 days.

(21) Appl. No.: 12/875,021

(22) Filed: Sep. 2, 2010

(65) Prior Publication Data
US 2011/0133277 A1 Jun. 9, 2011

(30) Foreign Application Priority Data
Dec. 4, 2009 (KR) ........................ 10-2009-0120116

(51) Int. Cl.
*H01L 29/66* (2006.01)
(52) U.S. Cl.
USPC ................... 257/339; 257/391; 257/E29.261

(58) Field of Classification Search
USPC .................................. 257/339, E29.261, 391
See application file for complete search history.

(56) References Cited

U.S. PATENT DOCUMENTS

| 4,300,150 A * | 11/1981 | Colak ........................ 257/336 |
| 5,591,657 A | 1/1997 | Fujishima et al. |
| 5,739,061 A | 4/1998 | Kitamura et al. |
| 6,933,560 B2 * | 8/2005 | Lee et al. ..................... 257/328 |
| 2003/0193067 A1 * | 10/2003 | Kim et al. ..................... 257/343 |

FOREIGN PATENT DOCUMENTS
JP 07-307401 11/1995

* cited by examiner

*Primary Examiner* — Tan N Tran
(74) *Attorney, Agent, or Firm* — Blakely Sokoloff Taylor & Zafman

(57) ABSTRACT

A semiconductor device includes a second conductive-type well configured over a substrate, a first conductive-type body region configured over the second conductive-type well, a gate electrode which overlaps a portion of the first conductive-type body region, and a first conductive-type channel extension region formed over the substrate and which overlaps a portion of the gate electrode.

10 Claims, 4 Drawing Sheets

SEMICONDUCTOR DEVICE

CROSS-REFERENCE TO RELATED APPLICATIONS

The present application claims priority of Korean Patent Application No. 10-2009-120116, filed on Dec. 4, 2009, which is incorporated herein by reference in its entirety.

BACKGROUND OF THE INVENTION

1. Field of the Invention

Exemplary embodiments of the present invention relates to a technology for fabricating a semiconductor device; and, more particularly, to a high-voltage semiconductor device.

2. Description of Related Art

A high-voltage semiconductor device is formed of the combination of extended drain MOS (EDMOS) transistors and laterally double diffused MOS (LONGS) transistors. Since each of the EDMOS transistor and the LDMOS transistor has high input impedance than a bipolar transistor, power gains of the EDMOS transistor and the LDMOS transistor are large, and a gate driving circuit may be simply implemented. Also, because each of the EDMOS transistor and the LDMOS transistor is a unipolar device, delay does not occur, where the delay occus due to accumulation or recombination of minority carriers during a long turn-off.

FIG. 1 is a cross-sectional view of a conventional laterally double diffused MOS (LDMOS) transistor; and FIG. 2 is a cross-sectional view of a conventional extended drain MOS (EDMOS) transistor. In the drawings, the LDMOS transistors and EDMOS transistors each having an N channel is illustrated. Also, FIG. 1 shows two LDMOS transistors disposed symmetrically based on a pickup region.

Referring to FIG. 1, the conventional LDMOS transistor includes a N-type well 12 formed in a substrate 11 having a device isolation layer 21, a P-type body region 13 formed over the N-type well 12, a gate electrode 20, a gate insulation layer 19, an N-type source region 16, an N-type drain region 15, an N-type impurity region 14, and a P-type pickup region 17.

The gate electrode 20 is formed over the substrate 11 to be partially overlapped with the P-type body region 13. The gate insulation layer 19 is interposed between the gate electrode 20 and the substrate 11.

The N-type source region 16 is formed in the P-type body region to be arrayed at one end of one side of the gate electrode 20. The N-type drain region 15 is formed over the N-type well 12 to be spaced apart from one end of another side of the gate electrode 20. The N-type impurity region 14 is formed in the N-type well 12 to surround the N-type drain region 15. The P-type pickup region 17 is formed in the P-type body region 13.

Since the length of a channel region C1 of the LDMOS transistor is short, the LDMOS transistor is used as a switching device controlling a large amount of current in the high-voltage semiconductor device. In order to form the channel region C1 having a short channel length, the channel region C1 is formed by selecting impurities having different diffusion characteristic and applying a double diffusion method. The channel region C1 of the LDMOS transistor is defied by overlap region of the body region 13 and the gate electrode 20.

Since the LDMOS transistor uses the double diffusion method to form a short channel region C1, the length of the channel region C1 cannot be varied. Thus, the LDMOS transistor may not be used as an analog device to control the operation of the high-voltage semiconductor device. Herein, the analog device is a device having a saturation region that a magnitude of a drain current $I_D$ is maintained as fixed value even though a magnitude of a voltage $V_{DS}$ increases, where the voltage $V_{DS}$ is a voltage between the N-type drain, region 15 and the N-type source region 16.

Accordingly, in order to provide the analog device controlling the operation of the high-voltage semiconductor device, a conventional extended drain MOS (EDMOS) transistor shown in FIG. 2 is introduced.

Referring to FIG. 2, the conventional EDMOS transistor includes a P-type first well 22 and an N-type second well 23 formed over a substrate 11 having a device isolation layer 21, a gate electrode 20, a gate insulation layer 19, an N-type source region 16, an N-type drain region 15, an N-type impurity region 16, a P-type pickup region 17, and a P-type impurity region 24.

The P-type first well 22 and the N-type second well 23 are junctioned. The gate electrode 20 may extend over both a portion of the P-type first well 22 and a portion of the N-type second well 23. The gate insulation layer 19 is interposed between the gate electrode 20 and the substrate 11. The N-type source region 16 is formed in the P-type first well 22 at one side of the gate electrode 20. The N-type drain region 15 is formed in the N-type second well 23 at another side of the gate electrode 20. The N-type impurity region 14 is formed in the N-type second well 23 to surround the N-type drain region 15. The P-type pickup region 17 is formed in the P-type first well 22. The P-type impurity region 20 is farmed in the P type first 22 to P-typepickup region 17.

Herein, a channel region 22 of the EDMOS transistor may be defined as a surface area of the substrate 11 where the gate electrode 20 is overlapped with the P-type first well 22. The length of the channel region C2 of the EDMOS transistor is longer than the length of the channel region C1 of the LDMOS transistor. It is easy to vary the length of the channel region C2 by adjusting a line width (area) overlapping the P-type first well 22 and a gate electrode 20. Thus, EDMOS transistor is used as the analog device in the high-voltage semiconductor device.

When one type transistors of the LDMOS transistor or the EDMOS transistor are used, it is difficult to achieve desired operating characteristics. That is, the conventional high-voltage semiconductor device has to be formed of the combination of the LDMOS transistor and the EDMOS transistor. Thus, structures of the high-voltage semiconductor device are complex, and the implementation is not easy. Also, high level of the fabrication process is required due to the structure complexity, and thus, high production unit cost and a long production time are needed.

The channel length of the channel region C2 of the EDMOS transistor can be varied. If the channel length of the EDMOS transistor is formed to have the channel length of the LDMOS transistor, the EDMOS transistor may be used as the switching device. When the location of the interface between the P-type second well 22 and the N-type second well 23 is adjusted in order to decrease the channel length of the EDMOS transistor, space between the N-type source region 16 and the N-type second well 23 is decreased. Thus, breakdown voltage characteristic of the EDMOS transistor is seriously deteriorated.

SUMMARY OF THE INVENTION

An embodiment of the present invention is directed to a semiconductor device having a simpler structure than a conventional high-voltage semiconductor device.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a semiconductor device includes a second conductive-type well configured over a substrate; a first conductive-type body region configured over the second conductive-type well; a gate electrode which overlaps a portion of the first conductive-type body region; and a first conductive-type channel extension region formed over the substrate and which overlaps a portion of the gate electrode.

The first conductive-type channel extension region may extend over both a portion of the first conductive-type body region and a portion of the second conductive-type well. The first conductive-type channel extension region may be formed in the second conductive-type well in contact with the first conductive-type body region. The first conductive-type channel extension region may be formed in the second conductive-type well and is spaced apart from the first conductive-type body region.

An impurity doping concentration of the first conductive-type body region may be higher than that of the first conductive-type channel extension region.

The semiconductor device may further include a first channel formed by overlap of the gate electrode and the first conductive-type body region; and a second channel formed by overlap of the gate electrode and a first conductive-type well disposed over the substrate. The second channel may have smaller threshold voltage level than the first channel.

The semiconductor device may further includes a device isolation layer configured over the substrate to define an active region; a first conductive-type pickup region disposed in the first conductive-type body region; a second conductive-type source region disposed in the first conductive-type body region on one side of the gate electrode; and a second conductive-type drain region disposed in the second conductive-type well and spaced apart from one end of another side of the gate electrode.

An area of an overlap between the first conductive-type channel extension region and the gate electrode may be controlled based on a predetermined characteristic of the semiconductor device. A depth of the first conductive-type channel extension region may be greater than that of the second conductive-type source region, and the depth of the first conductive-type channel extension region may be smaller than that of the first conductive-type body region based on an upper surface of the substrate. The device isolation layer between the gate electrode and the second conductive-type drain region may partially overlap a lower portion of the gate electrode. The first conductive-type channel extension region may be formed in the second conductive-type well spaced apart from the first conductive-type body region, and a space between the conductive type channel extension region and the device isolation layer is greater than a space between the first conductive-type body and the first conductive-type channel extension region under the gate electrode.

The semiconductor device may further include a second conductive-type buried purity region configured under the second conductive-type well and having a higher impurity doping concentration than the second conductive-type well.

A threshold voltage level of the first conductive-type channel extension region and a threshold voltage level of the first conductive-type body region may be different from each other.

DESCRIPTION OF SPECIFIC EMBODIMENTS

Figure 1:
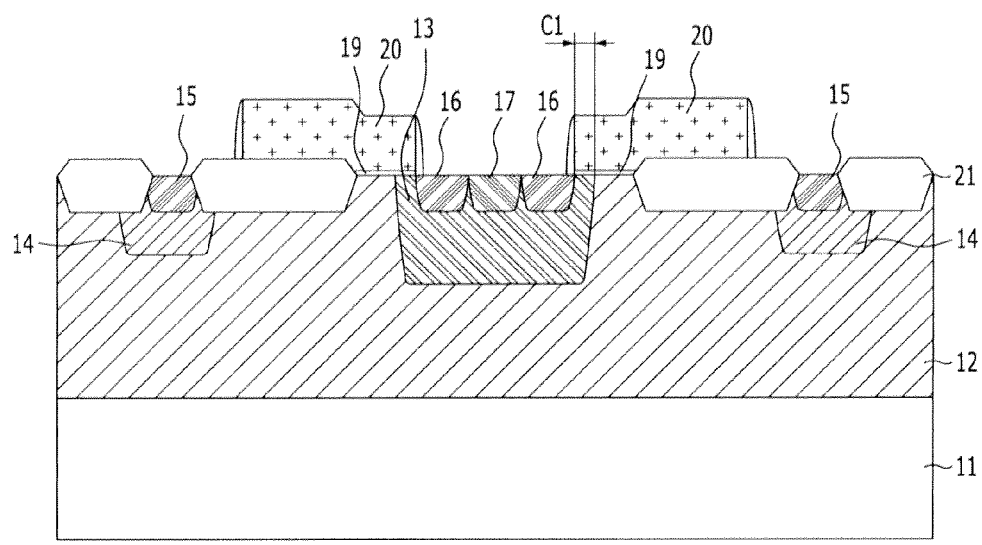
FIG. 1 is a cross-sectional view of a conventional laterally double diffused MOS (LDMOS) transistor.
Figure 2:
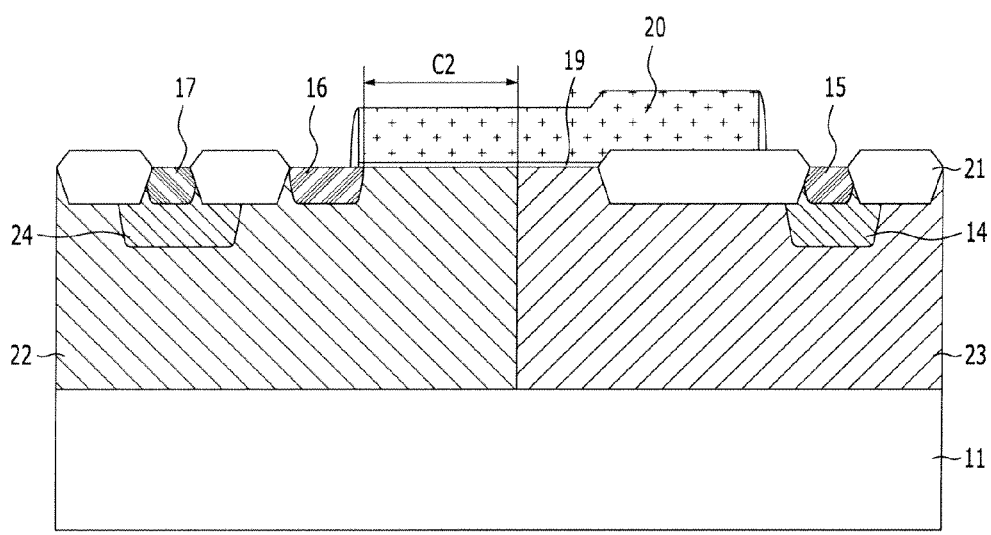
FIG. 2 is a cross-sectional view of a conventional extended drain MOS (EDMOS) transistor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention provides a high-voltage semiconductor device having a simpler structure than a conventional high-voltage semiconductor device including the combinations of a laterally double diffused MOS (LDMOS) transistor used as a switching device and an extended drain MOS (EDMOS) transistor used as an along device. To this end, the present invention provides a high-voltage semiconductor device including one type transistors of the LDMOS transistor or the EDMOS transistor. To be specific, one embodiment of the present invention includes a channel extension region which can vary the channel length the LDMOS transistor used as the switching device, and thus, the LDMOS transistor may be used as the analog device. Also, another embodiment of the present invention includes an impurity region surrounding a pickup region extended to be overlapped with the gate electrode in the EDMOS transistor, and decreases an effective channel length of an EDMOS transistor to a channel length of a LDMOS transistor, and thus, the EDMOS transistor may be used as the switching device while maintaining a breakdown voltage BV characteristic.

Hereafter, a case where the technological concept of the present invention is applied to a laterally double diffused MOS (LDMOS) and an extended drain MOS (EDMOS) transistor having an N channel will be described exemplarily in the following embodiments. In the following description, a first conductive-type is a P type while a second conductive-type is an N type. Of course, the technological concept of the present invention may be applied to a laterally double diffused MOS (LDMOS) and an EDMOS transistor having a P channel as well. In this case, the first conductive-type is an N type while the second conductive-type is a P type.

1$^{ST}$ EMBODIMENT

A first embodiment of the present invention provides a semiconductor device having a channel extension region which can vary or increase a channel length of a LDMOS transistor used as a switching device in a high-voltage semiconductor device. Thus, the LDMOS transistor may be used as an analog device in the high-voltage semiconductor device.

Figure 3A:
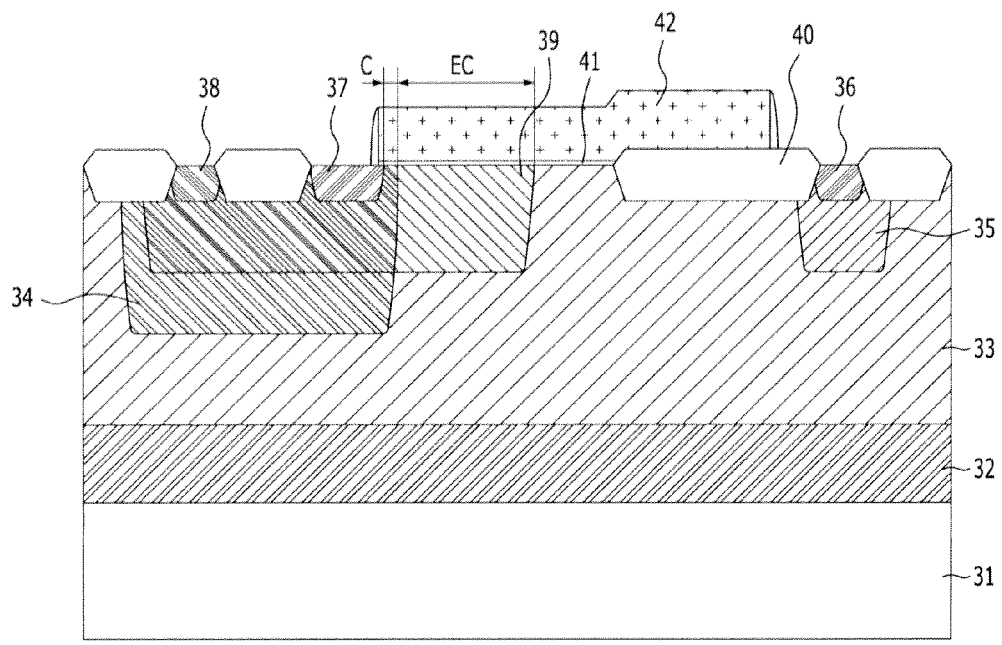
FIGS. 3A to 3C illustrate cross-sectional views of a semiconductor device in accordance with a first embodiment of the present invention.
Figure 3B:
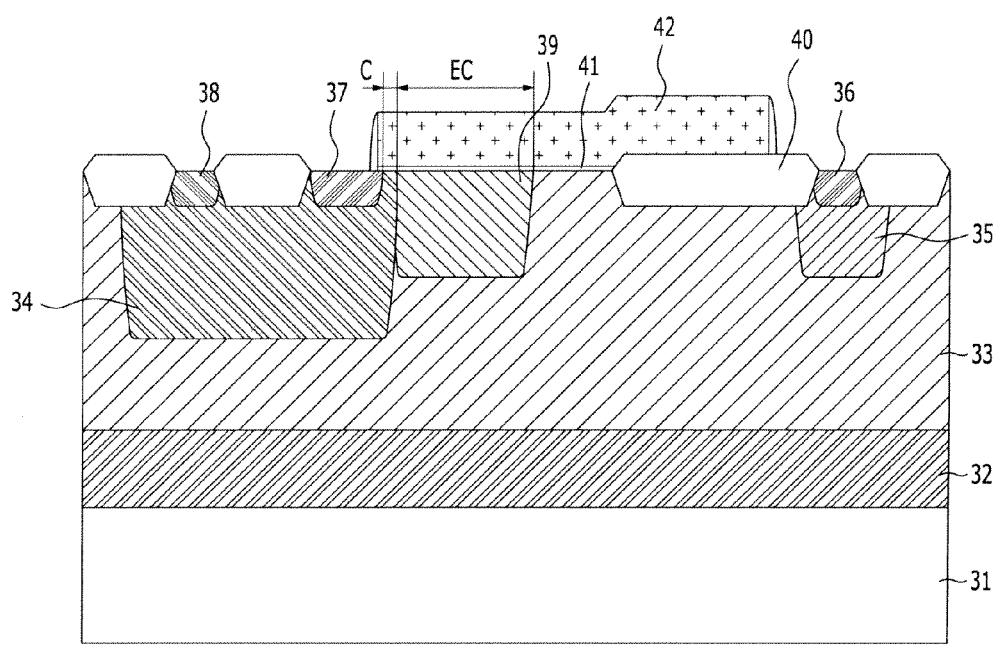
Figure 3C:
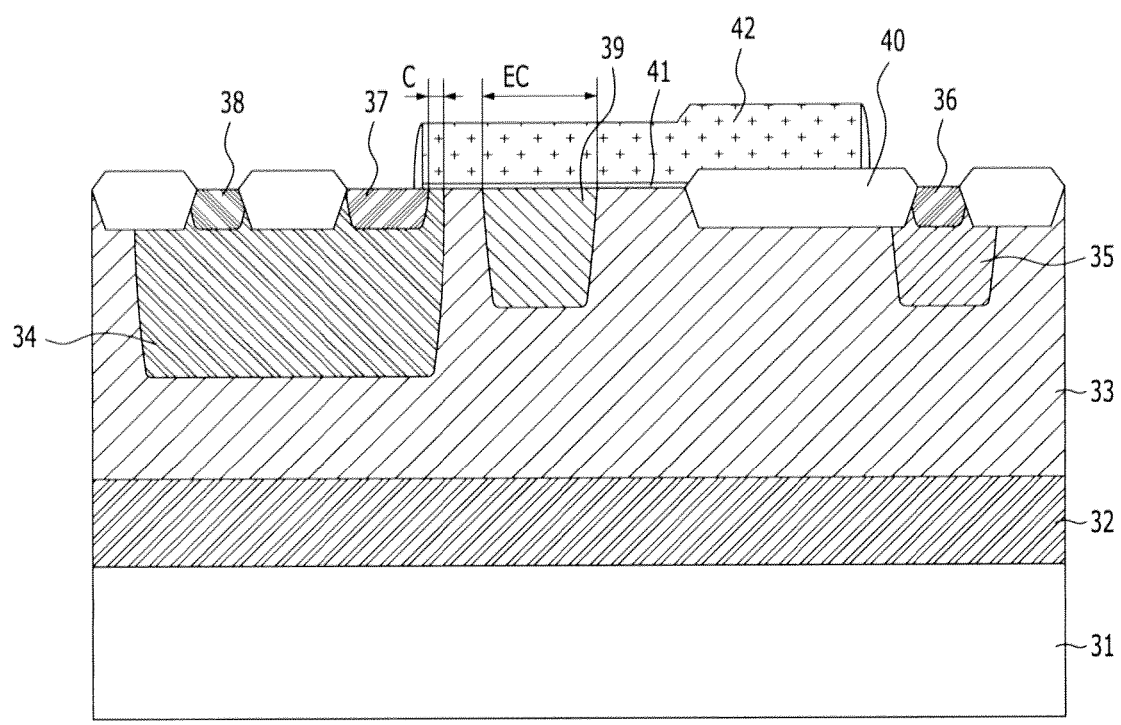

FIGS. 3A to 3C illustrate cross-sectional views of a semiconductor device in accordance with a first embodiment of the present invention.

Referring to FIGS. 3A to 3C, the semiconductor device in accordance with a first embodiment of the present invention includes a second conductive-type well 33 formed over a substrate 31 having a device isolation layer 40, a first conductive-type body region 34 formed in the second conductive-type well 33, gate electrode 42, a gate insulation layer 41, a second conductive-type source region 37, a second conductive-type drain region 36, a second conductive-type impurity region 35, a first conductive-type pickup region 38 formed in the first conductive-type body region 34, and a first conductive-type channel extension region 39.

The gate electrode 42 is formed over the substrate 31 to overlap with a portion of the first conductive-type body region 34. The gate insulation layer 41 is interposed between the gate electrode 42 and the substrate 31. The second conductive-type source region 37 is formed in the first conductive-type body region 34 to be arrayed at one end of one side of the gate electrode 42. The second conductive-type drain region 36 is formed in the second conductive-type well 33 to be spaced apart from one end of another side of the gate electrode 42. The second conductive-type impurity region 35 is formed in the second conductive-type well 33 to surround the second conductive-type drain region 36. The first conductive-type channel extension region 39 is formed in the second conductive-type well 33 and is overlapped with the gate electrode 42.

The first conductive-type channel extension region 39 may have a lower impurity doping concentration than the first conductive-type body region 34.

Herein, a channel region C of the LDMOS transistor having the above structure may be defined as an overlap region where the first conductive-type body region 34 is overlapped with the gate electrode 42. An extended channel region EC formed through the first conductive-type channel extension region 39 may be defined as an overlap region where the first conductive-type channel extension region 39 is overlapped with the gate electrode 42. Therefore, a total channel length of the LDMOS transistor is defined by sum of the channel length of the channel region C and the channel length of the extended channel region EC.

The device isolation layer 40 disposed between the gate electrode 42 and the second conductive-type drain region 36 may be partially overlapped with a lower portion of the gate electrode 42. A drift region is defined as an overlap region where the gate electrode 42 is overlapped with the device isolation layer 40, and an accumulation region is defied as an overlap region where the gate electrode 42 is overlapped with the second conductive-type well 33.

The semiconductor device in accordance with the first embodiment of the present invention includes the first conductive-type channel extension region 39 in order to use the LDMOS transistor an analog device by increasing the channel length of the LDMOS transistor.

To be specific, as shown in FIG. 3A, the first conductive-type channel extension region 39 may an impurity region surrounding the first conductive-type pickup region 38 and may be extended to the region under the gate electrode 42, that is, the first conductive-type channel extension region 39 may extend over both a portion of the first conductive-type body region 34 and a portion of the second conductive-type well 33. Also, as shown in FIG. 3B, the first conductive-type channel extension region 39 may be formed in the second conductive-type well 33 to contact to the first conductive-type body region 34. As shown in FIG. 3C, the first conductive-type channel extension region 39 may be formed in the second conductive-type well 33 to be spaced apart from the first conductive-type body region 34. A depth of the first conductive-type channel extension region 39 may be greater than that of the second conductive-type source region 37, and smaller than that of the first conductive-type body region 34 based on the upper surface of the substrate 31.

In the semiconductor device shown in FIGS. 3A and 3B, the second conductive-type source region 37, the channel region C, the extended channel region EC, the accumulation region, the drift region and the second conductive-type drain region 36 are sequentially formed according to a horizontal direction of the surface of the substrate 31. In the semiconductor device shown in FIG. 3C, the second conductive-type source region 37, the channel region C, a first accumulation region, the extended channel region EC, a second accumulation region, the drift region and the second conductive-type drain region 36 are sequentially formed according to a horizontal direction of the surface of the substrate 31.

When the first conductive-type channel extension region 39 is spaced apart from the first conductive-type body region 34, the width of the first accumulation region adjacent to the second conductive-type source region 37 may be smaller than that of the second accumulation region adjacent to the second conductive-type drain region 36. Herein, the first accumulation region is defied as an overlap region where the gate electrode 42 is overlapped with the second conductive-type well 33 interposed between the first conductive-type body region 34 and the first conductive-type channel extension region 39. The second accumulation region is defied as an overlap region where the gate electrode 42 is overlapped with the second conductive-type well 33 interposed between the first conductive-type channel extension region 39 and the device isolation layer 40.

A line width (area) of the overlap region between the first conductive-type channel extension region 39 and the gate electrode 42, i.e., a length of the extended channel region EC may be controlled according to the required characteristics of the semiconductor device. The length of the extended channel region EC may be increased in the direction from the second conductive-type source region 37 to the second conductive-type drain region 36.

The LDMOS transistor according to the first embodiment of the present invention includes the extended channel region EC, whose channel length is variable through forming of the first conductive-type channel extension region 39. Thus, the LDMOS transistor may be used as the analog device. That is, the high-voltage semiconductor device having only the LDMOS transistors may be provided, and thus the structure of the high-voltage semiconductor device may be simplified and the difficulty in designing may be decreased. Also, as the structure of the high-voltage semiconductor device is simplified, difficulty in a fabrication process, production unit cost and production time may be reduced.

Furthermore, since the first conductive-type channel extension region 39 has lower impurity doping concentration than the first conductive-type body region 34, current characteristics of the semiconductor device may be improved by providing two regions having different threshold voltage levels from each other within one transistor. That is, the threshold voltage level of the first conductive-type channel extension region 39 and the threshold voltage level of the first conductive-type body region 34 are different from each other in the LDMOS transistor.

To be specific, when the threshold voltage level of the transistor is uniform, that is, one threshold voltage level exists within the transistor, there is a trade off relationship between off-current and on-current. As the threshold voltage level is increased, the off-current is decreased, and the on-current is also decreased as much as increase amount of the threshold voltage level. On the other hand, as the threshold voltage level is decreased, the on-current is increased, and the off-current is also increased as much as decrease amount of the threshold voltage level.

However, in the semiconductor device according to the first embodiment of the present invention, since the impurity doping concentration of the first conductive-type body region 34 is higher than that of the first conductive-type channel extension region 39, the threshold level of the extended channel region EC, where the first conductive-type channel extension region 39 and the gate electrode are overlapped, is relatively lower than that of the channel region C, where the first conductive-type body region 34 and the gate electrode are overlapped. Since the off-current is controlled by the threshold voltage level of the channel region C adjacent to the second conductive-type source region 37, and the threshold voltage level of the channel region C is relatively greater than that of the extended channel region EC, the off-current may be decreased. In this way, since the on-current is controlled by the threshold voltage level of the extended channel region EC having a greater channel length than the channel region C, and the threshold voltage level of the extended channel region EC is relatively lower than that of the channel region C, the on-current may be increased.

The semiconductor device according to the first embodiment of the present invention, the current characteristics of the semiconductor device may be improved by simultaneously providing two regions having different threshold voltage levels from each other within one transistor. That is, while the off-current may be decreased, the on-current may be increased.

Also, the semiconductor device further includes a second conductive-type buried impurity layer 32 formed under the second conductive-type well 33. The second conductive-type buried impurity layer has a higher impurity doping concentration than the second conductive-type well 33. The second conductive-type buried impurity layer 32 prevents the excessive extension of a depletion region which extended from the second conductive-type drain region 36 between operations, and improves a punch through voltage. Thus, a breakdown voltage characteristic of the semiconductor device is improved.

$2^{nd}$ EMBODIMENT

A second embodiment of the present invention provides a semiconductor device which can decrease an effective channel length of an EDMOS transistor to a channel length of a LDMOS transistor. Thus, the EDMOS transistor used as an analog device in a high-voltage semiconductor device may be used as a switching device while maintaining a breakdown voltage characteristic.

Figure 4:
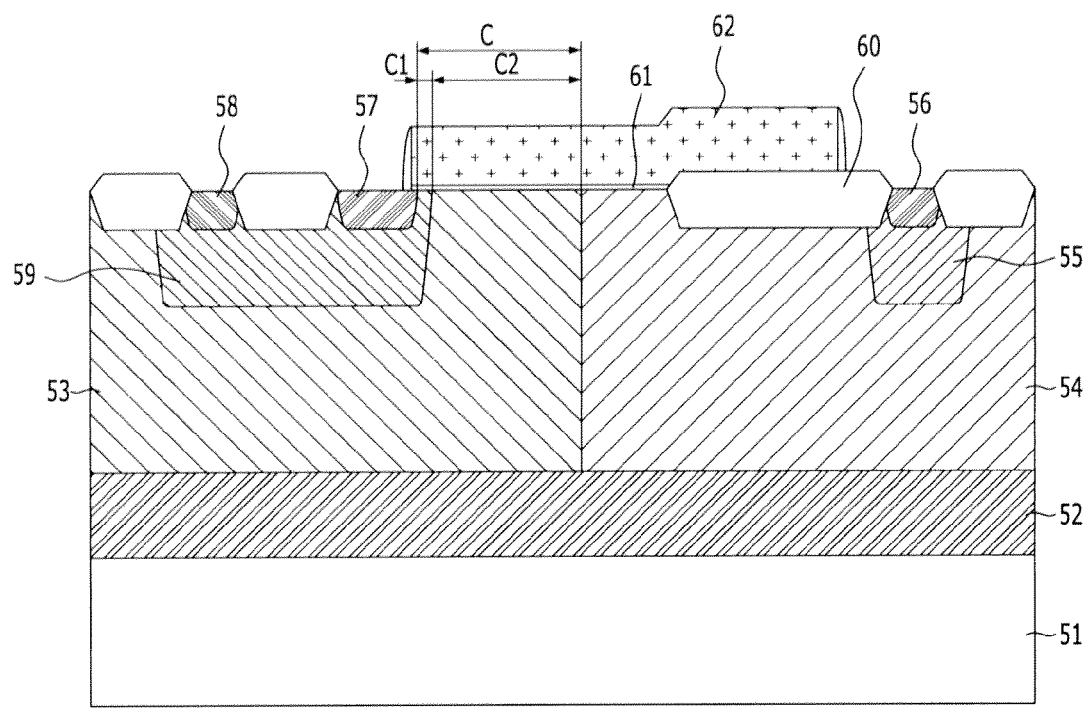
FIG. 4 illustrates a cross-sectional view of a semiconductor device in accordance with a second embodiment of the present invention.

FIG. 4 illustrates a cross-sectional view of a semiconductor device in accordance with a second embodiment of the present invention.

Referring to FIG. 4, the semiconductor in accordance with the second embodiment of the present invention includes a first conductive-type first, well 53 and a second conductive-type second well 54 formed over a substrate 51 having a device isolation layer 60, a gate electrode 62, a gate insulation layer 61, a first conductive-type first impurity region 59, a second conductive-type source region 57, a second conductive-type drain region 56, a second conductive-type second impurity region 55 and a first conductive-type pickup region 58.

The first conductive-type first well 53 and the second conductive-type second well 54 are junctioned. The gate electrode 62 may extend over both a portion of the first conductive-type first well 53 and a portion of the second conductive-type second well 54 over the substrate 51. The gate insulation layer 61 is interposed between the gate electrode 62 and the substrate 51. The first conductive-type first impurity region 59 is formed in the first conductive-type first well 53 and partially overlapped with the gate electrode 62. The second conductive-type source region 57 is formed in the first conductive-type first impurity region 59 to be arrayed at one end of one side of the gate electrode 62. The second conductive-type drain region 56 is formed in the second conductive-type second well 34 to be spaced apart from one end of another side of the gate electrode 62. The second conductive-type second impurity region 55 is formed in the second conductive-type second well 54 to surround the second conductive-type drain region 56. The first conductive-type pickup region 59 is formed in the first conductive-type first impurity region 59. An impurity doping concentration of the first conductive-type first impurity region 59 may be higher than that of the first conductive-type first well 53.

Herein, a channel region C of the EDMOS transistor having the above structure may be defined as a surface area of a substrate 51 in an area from one end of one side of the second conductive-type source region 57 under the gate electrode 62 to an interface between the first conductive-type first well 53 and the second conductive-type second well 54. hereinafter, for the sake of convenience in description, an overlap region where the first conductive-type first impurity region 59 is overlapped with the gate electrode 62 is referred to as a first channel region C1, and an overlap region where the first conductive-type first well 53 is overlapped with the gate electrode is referred to as a second channel region C2.

The semiconductor device according to the second embodiment of the present invention, an effective channel length of the channel region C of the EDMOS transistor is reduced in order to use the EDMOS transistor as a switching device. The first conductive-type first impurity region 59 is extended to partially overlap with the gate electrode 62. That is, the first channel region C1 is provided. Herein, the first conductive-type first impurity region 59 is formed to improve a contact characteristic of the first conductive-type pickup region 58.

To be specific, since the first conductive-type first impurity region 59 has a higher impurity doping concentration than the first conductive-type first well 53, the threshold voltage of the first channel region C1 may be greater than that of the second channel region C2. Thus, the first channel region C1 may serve as an effective channel which determines on and off operations of the EDMOS transistor. When the EDMOS transistor is designed, the EDMOS transistor may be used as the switching device by controlling the channel length of the first channel region C1. As the EDMOS transistor is used as the switching device by using the first channel region C1, size or location of the first conductive-type first well 53 and the second conductive-type second well 54 may be maintained without change. Thus, a predetermined breakdown voltage characteristic may be prevented from being deteriorated.

The channel length of region C1 may be controlled according to the required characteristics of the semiconductor device. The channel length of the first channel region C1 may be decreased in the direction from the second conductive type drain region 56 to the second conductive type source region 57.

The EDMOS transistor according to the second embodiment of the present invention may be used as the switching device by including the first channel region C1, while maintaining the breakdown voltage characteristic.

That is, the high-voltage semiconductor device having only the EDMOS transistors may be provided, and thus the structure of the high-voltage semiconductor device may be simplified and the difficulty in designing may be decreased. Also, as the structure of the high-voltage semiconductor device is simplified, difficulty in a fabrication process, production unit cost and production time may be reduced.

In the semiconductor device according to the second embodiment of the present invention, as the impurity doping concentration of the first conductive-type first impurity region 59 is higher than that of the first conductive-type first well 53, the current characteristics of the semiconductor device may be improved by simultaneously providing two regions having different threshold voltage levels from each other within one transistor. That is, while the off-current may be decreased, the on-current may be increased.

In addition, the semiconductor device according to the second embodiment of the present invention, further includes a second conductive-type buried impurity layer 52 formed under the first conductive-type first well 53 and the second conductive-type second well 54. The second conductive-type buried impurity layer 52 has a higher impurity doping concentration than the first conductive-type first well 53 and the second conductive-type second well 51. The second conductive-type buried impurity layer 52 prevents the excessive extension of a depletion region which extended from the second conductive-type drain region 56 between operations, and improves a punch through voltage. Thus, the breakdown voltage characteristic of the semiconductor device is improved.

According to the present invention, the LDMOS transistor used as the switching device may be used as an analog device by including the channel extension region which varies a channel length and extends a channel area.

According to the present invention, the structure of the high-voltage semiconductor device may be simplified and the difficulty in designing may be decreased. Also, as the structure of the high-voltage semiconductor device is simplified, difficulty in a fabrication process, production unit cost and production time may be reduced.

Moreover, since the impurity doping concentration of the first conductive type body region is higher than that of the channel extension region, the current characteristics of the semiconductor device may be improved by simultaneously providing two regions having different threshold voltage levels from each other within one transistor. That is, while the off-current may be decreased, the on-current may be increased.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
    a second conductive-type well configured in a substrate;
    a first conductive-type body region configured over the second conductive-type well;
    a gate electrode which overlaps a portion of the first conductive-type body region; and
    a first conductive-type channel extension region formed in the substrate and which overlaps a portion of the gate electrode,
    wherein a depth of the first conductive-type channel extension region is greater than that of a second conductive-type source region, and the depth of the first conductive-type channel extension region is smaller than that of the first conductive-type body region from a top surface of the substrate.

2. The semiconductor device of claim 1, wherein the first conductive-type channel extension region extends over both a portion of the first conductive-type body region and a portion of the second conductive-type well.

3. The semiconductor device of claim 1, wherein an impurity doping concentration of the first conductive-type body region is higher than that of the first conductive-type channel extension region.

4. The semiconductor device of claim 1, further including:
    a first channel formed by overlap of the gate electrode and the first conductive-type body region; and
    a second channel formed by overlap of the gate electrode and the first conductive-type channel extension region disposed in the substrate.

5. The semiconductor device of claim 4, wherein a threshold voltage level of the second channel is smaller than a threshold voltage level of the first channel.

6. The semiconductor device of claim 1, further comprising:
    a device isolation layer configured in the substrate to define an active region;
    a first conductive-type pickup region disposed in the first conductive-type body region;
    a second conductive-type source region disposed in the first conductive-type body region on one side of the gate electrode; and
    a second conductive-type drain region disposed in the second conductive-type well and spaced apart from one end of another side of the gate electrode.

7. The semiconductor device of claim 6, wherein an area of an overlap between the first conductive-type channel extension region and the gate electrode is controlled based on a predetermined characteristic of the semiconductor device.

8. The semiconductor device of claim 6, wherein the device isolation layer between the gate electrode and the second conductive-type drain region partially overlaps a lower portion of the gate electrode.

9. The semiconductor device of claim 1, further comprising:
    a second conductive-type buried impurity region configured under the second conductive-type well and having a higher impurity doping concentration than the second conductive-type well.

10. The semiconductor device of claim 1, wherein a threshold voltage level of the first conductive-type channel extension region and a threshold voltage level of the first conductive-type body region are different from each other.

* * * * *